United States Patent
Saiki

Patent Number: 5,272,502
Date of Patent: Dec. 21, 1993

[54] DOUBLE-SURFACE CONCURRENT EXPOSURE DEVICE

[76] Inventor: Minoru Saiki, 27-3, Kuramae 4-chome, Taito-ku, Tokyo, Japan

[21] Appl. No.: 826,060

[22] Filed: Jan. 27, 1992

[30] Foreign Application Priority Data

Jul. 31, 1991 [JP] Japan .................. 3-212996

[51] Int. Cl.$^5$ ............... G03B 27/62; G03B 27/64
[52] U.S. Cl. ........................... 355/76; 355/26; 355/73; 355/87; 355/91; 355/93
[58] Field of Search ............. 355/26, 76, 73, 87, 355/91, 94

[56] References Cited

U.S. PATENT DOCUMENTS

| | | | |
|---|---|---|---|
| 3,512,487 | 5/1970 | Kranz et al. | 355/76 |
| 4,565,443 | 1/1986 | Yazaki | 355/26 |
| 4,721,980 | 1/1988 | Yazaki | 355/26 |
| 4,827,316 | 5/1989 | Brown | 355/91 |
| 5,017,960 | 5/1991 | Tuulse | 355/91 |

Primary Examiner—Monroe H. Hayes
Attorney, Agent, or Firm—Hedman, Gibson & Costigan

[57] ABSTRACT

Both surfaces of a substrate formed with a resist or a thin film sample can be exposed concurrently and either one surface exposure or both surface concurrent exposure of the sample can be carried out. The first groove for use in fixing the flat plate holder of transparent material held by a frame to the frame under a suction of vacuum and fixing is formed at a lower circumferential edge of the flat plate holder, the second groove for sucking by vacuum and fixing the mask film on the upper surface of the flat plate holder is formed at the upper surface of the flat plate holder and at the same time there is provided a seal member for sealing a clearance between the mask film and the end part of the sample formed with a resist position aligned to each other, and suction holes for use in sucking by vacuum and fixing the lower surface of the end part of the sealed sample are communicated with each of the seal member, mask film and the flat plate holder in a sample holding device of the exposure device.

1 Claim, 4 Drawing Sheets

DOUBLE-SURFACE CONCURRENT EXPOSURE DEVICE

DETAILED DESCRIPTION OF THE INVENTION

1. Industrial Field

This invention relates to a sample holding device in an exposure device for holding both a copper-clad laminate having a resist formed thereon, for example, and a mask film abutted against either one surface or both surfaces of the copper-clad laminate while their positions being aligned to each other and for exposing the sample of the copper-clad laminate and to a double-surface concurrent exposure device and more particularly a sample holding device in an exposure device for performing an exposure while a mask being aligned to a sample of a substrate or a thin film when an IC lead frame, a semiconductor, other electronic parts or various precision components are formed.

2. Prior Art

In the prior art exposure device, a plurality of fine holes for use in applying a vacuum were formed at an upper surface at a central part of a plastic supporting block, a copper-clad laminates formed with a resist was located on the supporting block, then a mask film sucked and held in vacuum in advance at the lower surface of the glass plate was aligned in its position and overlapped to each other, a light was irradiated from above to perform an one-surface exposure. Upon completion of the one surface exposure, the copper-clad laminate was turned over, its lower was set to an upper side, the exposure was carried out in the same manner as that described above and both surfaces of the copper-clad laminates were exposed.

The prior art exposure device was operated such that after one surface of a copper-clad laminate formed with a resist thereon was exposed, the copper-clad laminate was turned over, its lower surface was set to an upper surface, the upper surface was exposed, resulting in that both surfaces of the copper-clad laminate could not be exposed.

Every time one surface of the sample was exposed, each of the copper-clad laminate and the mask film had to be aligned for their positions and so the prior art had some disadvantages that a turning-over work for the copper-clad laminate was required to cause a troublesome work to be required and also the working time was elongated.

In view of the aforesaid facts, the present invention has been completed and its object is to provide a sample holding device in an exposure device and a double-surface concurrent exposure device in which both surfaces of a substrate or a sample of thin film formed with a resist thereon can be exposed concurrently and at the same time an one-surface exposure or a double-surface concurrent exposure of the sample can be carried out.

The sample holding device in the exposure device in the present invention is constructed such that a photomask is closely contacted with a sample formed with a resist thereon, light is irradiated against it to perform an exposure, a first groove for use in vacuum sucking and fixing a flat plate holder of transparent material held by a frame to the frame is formed at a lower surface circumferential edge of the flat plate holder, a second groove for use in vacuum sucking and fixing a mask film on an upper surface of the flat plate holder is formed on the upper surface of the flat plate holder and a seal member for sealing a clearance between the mask film and the end part of the sample formed with a resist position set, and suction holes for use in applying a vacuum and fixing the lower surface of the end part of the sealed sample are arranged in each of the seal member, mask film and flat plate holder so as to be communicated to each other, respectively.

The sample holding device in the exposure device is constructed such that a first groove for use in vacuum sucking and fixing the flat plate holder of transparent material held by a frame to the frame is formed at a lower surface circumferential edge of the flat plate holder, a second groove for applying a vacuum and fixing a transparent film on an upper surface of the flat plate holder is formed on the upper surface of the flat plate holder, the mask film position set on the transparent film is fixed on the transparent film with a seal member and a clearance between the mask film position set and an end part of the sample formed with the resist is sealed by a seal member and the suction holes for applying a vacuum and fixing the lower surface of the end part of the sealed sample are arranged to communicate with each of the seal member, mask film, transparent film and the flat plate holder, respectively.

The seal member for use in sealing a clearance between the mask film of which position is aligned and an end part of the sample formed with a resist is applied as a belt-like piece composed of an adhesive tape or an pressure sensitive adhesive tape or a seal material having a thickness corresponding to a clearance between the mask film and the end part of the sample formed with the resist.

The double-surface concurrent exposure device of the present invention is comprised of a horizontal movement mechanism which can be reciprocated in a horizontal direction while the sample being held by any of the aforesaid sample holding devices and a lifting mechanism in a vertical direction for holding the upper mask film of which position is aligned at the upper surface of the sample.

Means for holding the upper mask film at the lifting mechanism in a vertical direction in the double-surface concurrent exposure device is operated such that an elastic magnetic packing is adsorbed at the lower surface of the metallic frame which can be moved up or down, the elastic magnetic packing is provided with the upper suction holes and the lower suction holes, the upper flat plate holder made of transparent material is removably attached to the lower part of the elastic magnetic packing, the upper suction groove communicating with the upper suction holes is formed at an upper circumferential edge of the upper flat plate holder, the upper flat plate holder is closely supported in a horizontal direction under a vacuum in the upper suction groove covered by the elastic magnetic packing, the lower surface circumferential edge of the upper flat plate holder is formed with the lower suction groove communicating with the lower suction hole of the upper flat plate holder and the lower surface of the upper flat plate holder is closely contacted with the upper mask film under a vacuum action in the lower suction groove.

A method of use of the sample holding device in the exposure device in the present invention will be described.

An inside of the first groove formed at the lower surface circumferential edge of the flat plate holder of transparent material held by the frame is held by vacuum and then the lower surface circumferential edge of the flat plate holder is adsorbed and fixed to the frame. Then, the mask film positioned on the upper surface of the flat plate holder is aligned in its position and then the inside of the second groove formed on the upper surface of the flat plate holder is held by vacuum and the mask film is fixed on the flat plate holder. Then, a seal material such as an adhesive tape having a thickness which corresponds to a clearance between the mask film and the end part of the sample formed with a resist is sealingly adhered around one side or more than two sides at the circumferential edge of the mask film and fixed. After the circumferential edge of the mask film is sealingly fixed, the seal member is provided with a suction hole communicating with each of the mask film and the flat plate holder. Then, the sample formed with the resist is mounted on the mask film, the lower surface of the sample end sealed while being position aligned is held by vacuum through the suction hole and then a circumferential edge of the sample is fixed on the seal member. In this way, an ultra-violet light is irradiated from below to perform an exposure while the mask film and the sample are position set.

In case of the aforesaid arrangement, it has been described the case in which the mask film is directly fixed on the flat plate holder and a transparent film may be present between the mask holder and the flat plate holder. This embodiment is effective when the mask film and the sample are small in their sized.

In case of using a transparent film, an inside part of the second groove formed on the upper surface of the flat plate holder is held by vacuum, and the transparent film is fixed on the flat plate. Then, the mask film mounted on the upper surface of the transparent film is position aligned, then a seal member such as an adhesive tape of the like having a thickness corresponding to a clearance between the mask film and an end part of the sample formed with the resist is adhered around one side of more than two sides of a circumferential edge of the mask film and sealingly fixed. After fixing the circumferential edge of the mask film, the seal member is provided with suction holes for communicating with each of the mask film, the transparent film and the flat plate holder, respectively. The sample formed with the resist is mounted on the mask film, the lower surface of the end part of the sample sealed while being position aligned is held by vacuum through the suction hole and the circumferential edge of the sample is fixed on the seal member. After this operation, the ultra-violet light is irradiated from below to perform an exposure.

The sample held by the sample holding device in the exposure device is held at an operator's side, thereafter the sample is moved to the rear side in a horizontal direction by the horizontal movement mechanism. The upper mask film held while being position aligned in advance with the upper surface of the sample is by the lifting device in a vertical direction, the lifting mechanism is lowered to set the upper mask film on the sample. Under this condition, the ultra-violet light is irradiated from above and below the sample to perform concurrently a double-surface exposure.

The upper mask film held by the lifting mechanism in a vertical direction is fled in the following manner. That is, the elastic magnetic packing is adsorbed under utilization of a magnetic force of the elastic magnetic packing to the lower surface of the metallic frame which can be moved up or down. An inside part in the upper suction groove of the upper flat plate holder made by transparent material communicating with the upper suction hole formed in the elastic magnetic packing is held by vacuum by a vacuum pump or the like and then the upper side flat holder is closely contacted with the lower surface of the elastic magnetic packing. An inside part of the lower suction groove communicating with the lower suction hole of the elastic magnetic packing is held by vacuum by a vacuum pump or the like at the lower surface of the upper flat plate holder and then the upper mask film is closely contacted with it. In this way, after the upper mask is closely contacted with the lower surface of the upper flat plate holder, the upper mask film is moved up and down by the lifting mechanism in a vertical direction and then the upper mask film is overlapped on the upper surface of the sample. In this way, the mask film is overlapped from each of the upper and lower surfaces of the sample and an ultra-violet light is irradiated from each of above and below the film to perform a double-surface concurrent exposure.

DESCRIPTION OF THE PREFERRED EMBODIMENT

Figure 1:
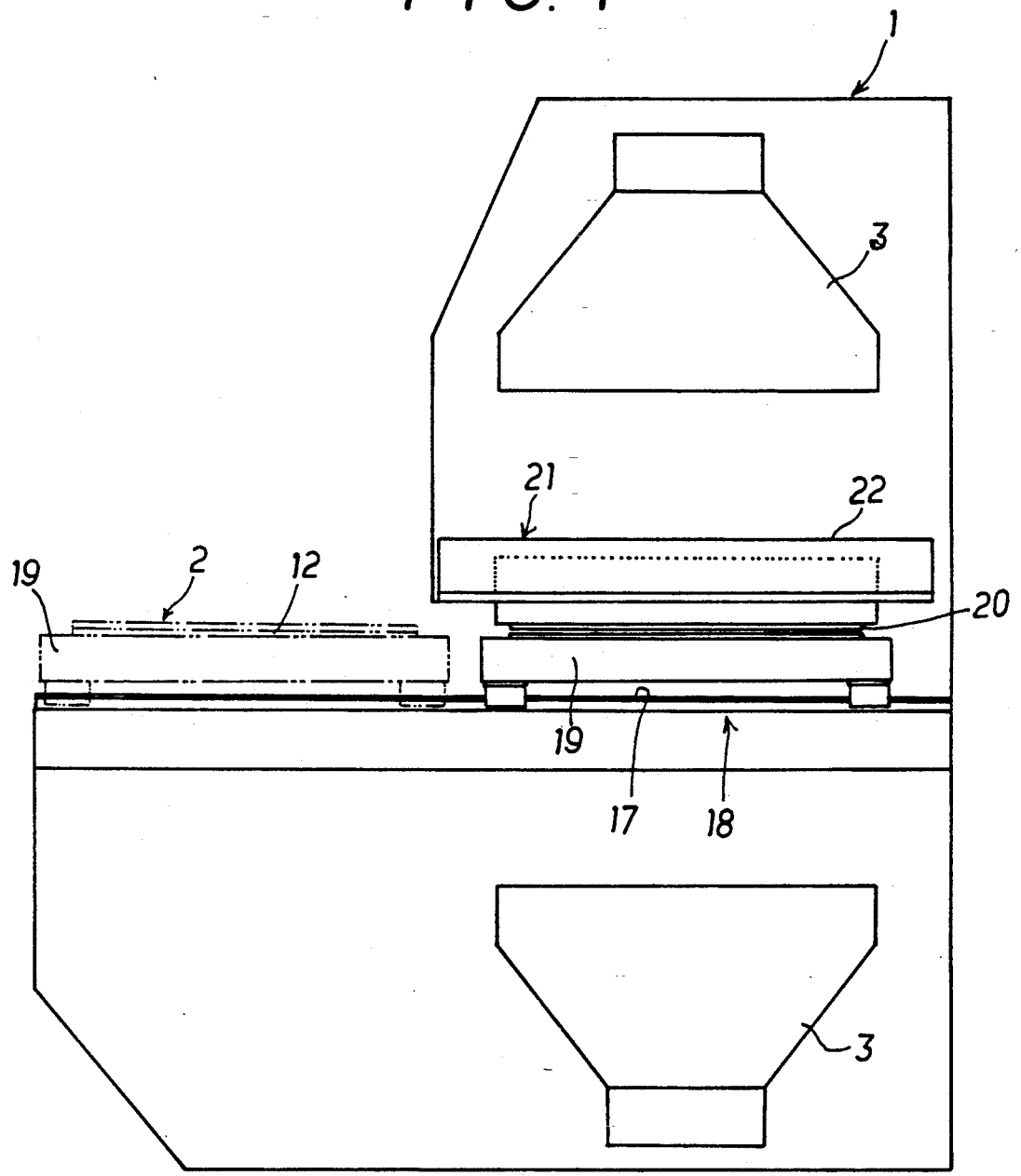
FIG. 1 is a schematic side elevational view for showing a double-surface exposure device of the present invention.

Referring now to the drawings, one preferred embodiment of the present invention will be described.

Figure 2:
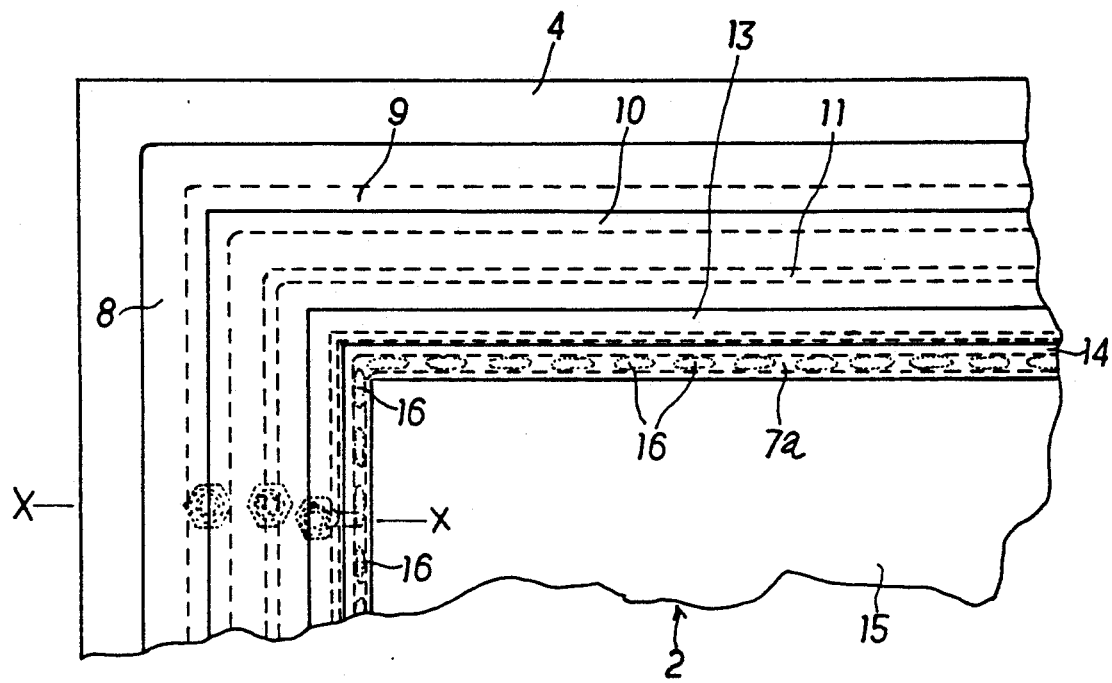
FIG. 2 is a schematic top plan view for showing a sample holding device in an exposure device of the present invention.
Figure 3:
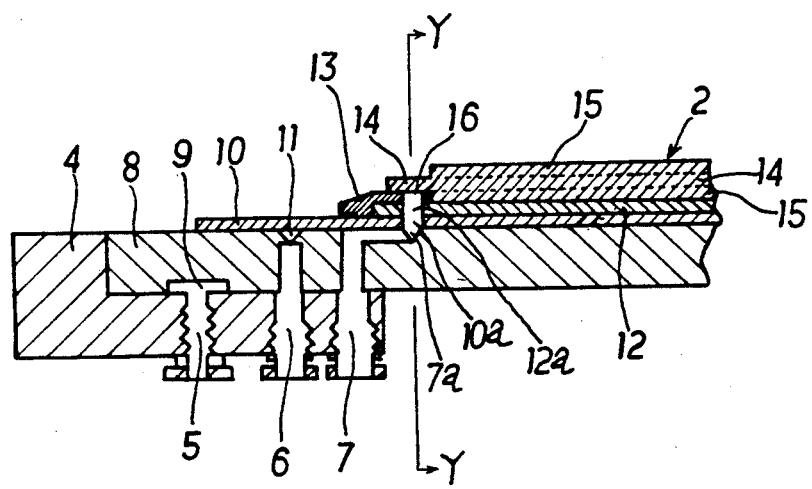
FIG. 3 is a sectional view taken along a line X—X of FIG. 2.
Figure 4:
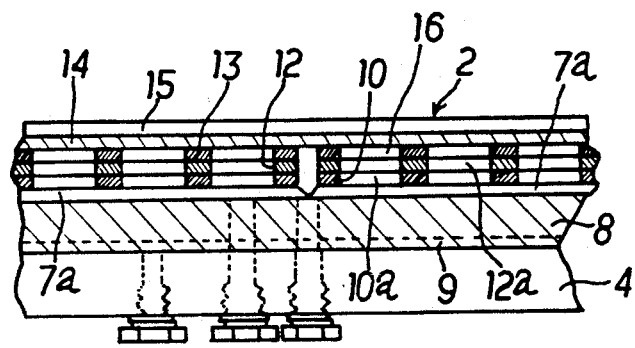
FIG. 4 is a sectional view taken along a line Y—Y of FIG. 3.

FIG. 1 is a schematic side elevational view for showing a double-surface exposure device of the present invention. FIG. 2 is a schematic top plan view for showing a sample holding device in the exposure device of the present invention. FIG. 3 is a sectional view take along a line X—X of FIG. 2. FIG. 4 is a sectional view taken along a line Y—Y of FIG. 3.

In the preferred embodiment, at first the case in which the transparent film is applied will be described and then another case in which the transparent film is not used will be described later.

1 denotes a double-surface exposure device which is provided with irradiation devices 3 for holding a sample 2 therein and irradiating an ultra-violet light to each of above and below the sample 2.

A horizontal part 4a of a frame 4 having a rectangular shape in its top plan view and having an L-shaped section is provided with the first through-pass hole 5, the second through-pass hole 6 and the third through-pass hole 7, respectively, in a predetermined spaced-apart relation.

A flat plate holder 8 formed by transparent material such as glass or the like is installed in a frame 4 and held in a horizontal direction. A lower circumferential edge of the flat plate holder 8 abutting against the horizontal part 4a of the frame 4 is formed with the first groove 9 communicating with the first through-pass hole 5. An inside part of the first groove 9 is set to a vacuum state and then the flat plate holder 8 is horizontally fixed to the frame 4. The upper surface of the flat plate holder 8 is formed with the second groove 11 for applying a vacuum and fixing the transparent film 10 communicated with the second through-pass hole 6 along a longitudinal or a lateral direction. The second groove 11 has been described in reference to a case in which the transparent film 10 is held by vacuum and fixed by vacuum in the groove. However, in place of the transparent film 10, it can be applied to the case in which the mask film 12 to be described later is suctioned by vacuum and fixed.

After the transparent film 10 is sucked by vacuum and fixed to the upper surface of the flat plate holder 8, the seal member 13 such as an adhesive tape or the like is adhered around one side or more than two sides of a circumference edge of the mask film 12 while the mask film 12 being position aligned to the upper surface of the transparent film 10 and sealingly fixed. It is important that a thickness of the seal member 13 such as an adhesive tape or the like corresponds to a thickness corresponding to a clearance between the mask film 12 and the end part of the sample 2 formed with the resist 15 (where the resist 15 is not formed). The sample 2 is formed with the resist 15 for use in forming a pattern while a circumferential edge of either one surface or both surfaces of a substrate or a thin plate 14 such as a copper-clad laminate or the like being left. After a circumferential edge of one side or more than two circumferential edges of the mask film 12 is sealingly fixed with the seal member 13, the seal member 13 is provided with suction holes 16. The suction holes 16 are formed so as to communicate with each of the holes 12a, 10a and the third through-pass hole 7 of the mask film 12, transparent film 10 and the flat plate holder 8, respectively. A series of elongated grooves 7a are formed above the third through-pass hole 7 and as shown in FIG. 4, the grooves are communicated with each of the suction holes 16, holes 12a and 10a.

Then, the sample 2 formed with the resist 15 is mounted on the mask film 12, the lower surface of the end part of the sample 2 sealed while being position aligned is sucked in vacuum through the suction holes 16, holes 12a, 10a and the third through-pass hole 7 and then the circumferential edge of the sample 2 is fixed on the seal member 13 (the mask film 12 is slightly larger than the sample 2).

Ultra-violet light is irradiated by radiators 3 from below while the mask film 12 and the sample 2 are being position aligned to each other and then an exposure is carried out. Exposure for the sample 2 may be of one-surface exposure and the double-surface concurrent exposure may also be attained.

In the event that the double-surface concurrent exposure is to be carried out, the mask film 12 and the sample 2 of which positions are aligned are installed on an X-table 19 provided with a horizontal moving mechanism 18 reciprocatably guided by the guide rails 17 or the like and moved. Above the sample 2 is mounted a Z-table 22 provided with a lifting mechanism 21 ascending or descending in a vertical direction while the upper mask film 20 being position aligned in advance. In this way, as shown in FIG. 1, the X-table 19 is moved in a rightward direction, the Z-table 22 is descended, the upper mask film 20 position aligned in advance is overlapped on the sample 2, ultra-violet light is irradiated through the upper and lower radiators 3 and 3 to perform the double-surface concurrent exposure of the sample 2.

Means for holding the upper mask film 20 in the lifting device 21 in a vertical direction is operated as follows. That is, the elastic magnetic packing 24 is adsorbed to the lower surface of the metallic frame 23 which is installed in the Z-table 22 and which can be moved up or down. The elastic magnetic packing 24 is formed with the upper suction hole 25 and the lower suction hole 26. The upper flat plate holder 27 made of transparent material is insertably attached in a horizontal direction below the elastic magnetic packing 24. An upper circumferential edge of the upper flat plate holder 27 is formed with an upper suction groove 28 communicating with the upper suction hole 25, and inside part of the upper suction groove 28 covered by the elastic magnetic packing 24 is sucked by vacuum, thereby the upper flat plate holder 27 is closely contacted and supported in a horizontal direction. The lower circumferential edge of the upper flat plate holder 27 is formed with the lower suction groove 29 communicating with the lower suction hole 26. The upper mask film 20 is closely contacted with the lower surface of the upper flat plate holder 27 under a vacuum suction in the lower suction groove 29.

Figure 5:
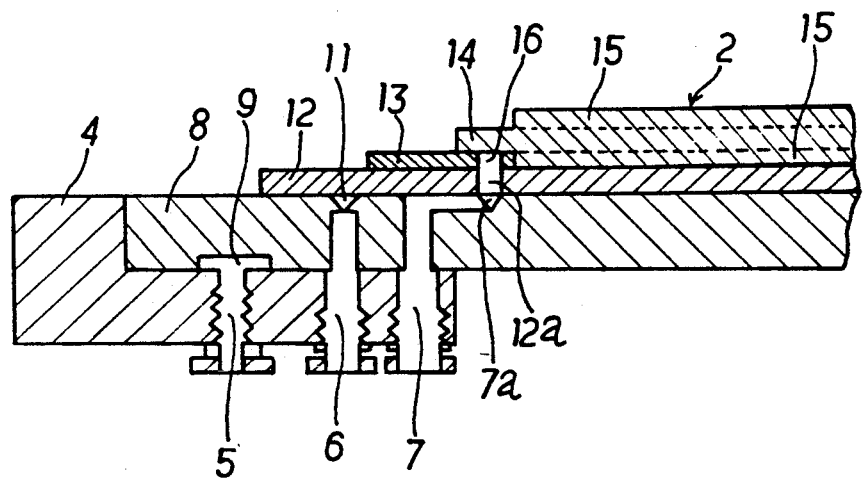
FIG. 5 is a schematic sectional view for showing another preferred embodiment of the sample holding device in an exposure device of the present invention.
Figure 6:
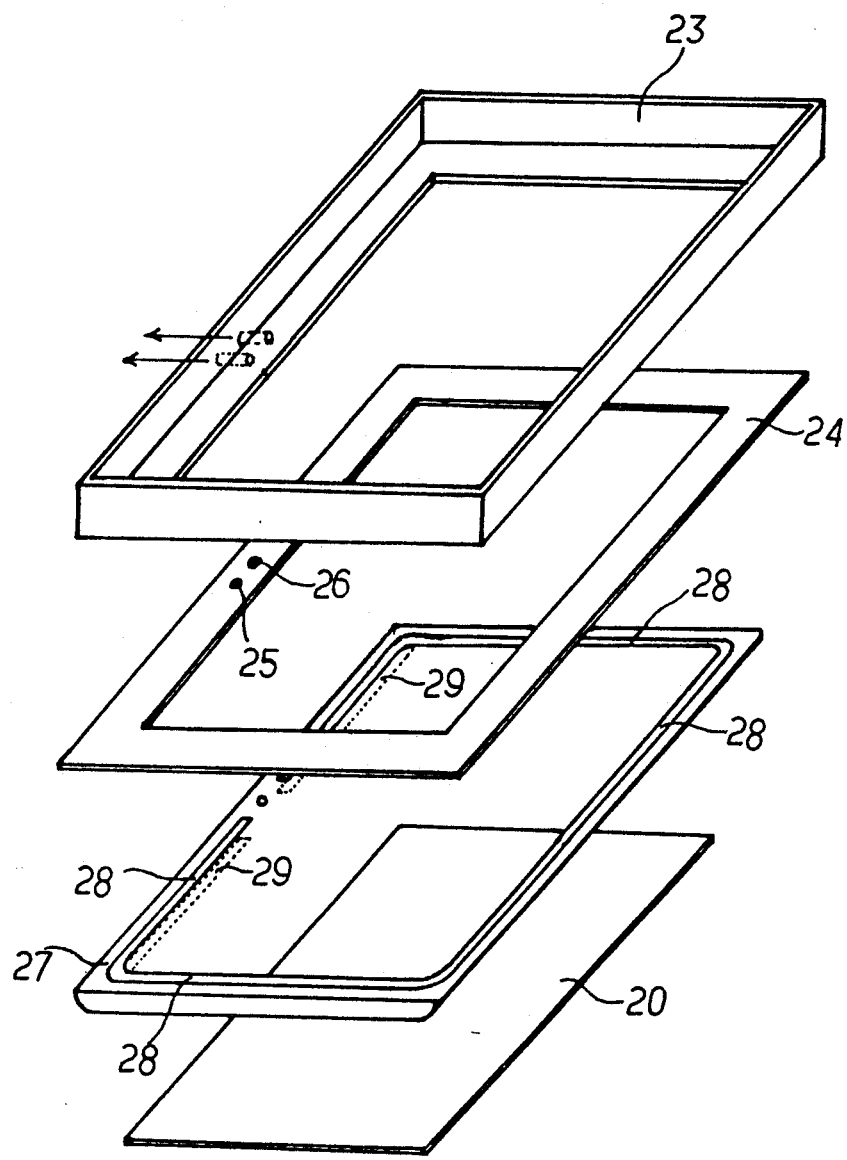
FIG. 6 is a schematic perspective view for showing a holding means for an upper mask film.

In the preferred embodiment, it has been described the case in which the transparent film 10 is used and the mask film 12 and the sample 2 are position aligned to each other and as shown in FIG. 5, the mask film 12 may be position aligned and fixed directly on the flat plate holder 8.

As apparent from the above description, the flat plate holder of transparent material is suction by vacuum and fixed to the frame, the mask film is position aligned, suctioned and fixed on the upper surface of the flat plate holder through the transparent film or the master film is directly mounted without passing through the transparent film, position aligned, subjected to vacuum and fixed, the clearance not formed with the resist is sealed with a seal member at the end part of the sample, the suction holes for use in suction by vacuum and fixing the lower surface of the end part of the sealed sample are communicated with each of the seal member, mask film (including the transparent film in case that the transparent film is used) and the flat plate holder, respectively, so that the mask film and the sample can be sucked and fixed while they are aligned in their positions. As a result, both surface of the substrate or sample of the thin film formed with the resist can be exposed concurrently. The double-surface concurrent exposure as well as one-surface exposure of the sample can be carried out.

In addition, as the seal member, the adhesive tape having a thickness corresponding to a clearance between the mask film and the end part of the sample formed with the resist is used, thereby a fixing of the mask film and a sealing of the clearance at the end of the sample may easily be carried out and a work for punching a vacuum suction hole in the adhesive tape is simple and a position aligning work may easily be carried out, In addition, the exposure device is provided with a horizontal movement mechanism which can be reciprocated in a horizontal direction while the sample is being held and the lifting mechanism in a vertical direction for holding the upper mask film position aligned on the upper surface of the sample, so that the sample is moved to one end through the horizontal moving mechanism while the mask film being set at the lower surface of the sample and the upper mask film is lowered through the lifting mechanism, ultra-violet light is irradiated concurrently from above and below the sample while the upper mask film is overlapped on the upper surface of the sample so as to enable a double-surface concurrent exposure to be carried out.

In particular, the means for holding the upper mask film on the lifting mechanism in a vertical direction is constructed such that the elastic magnetic packing is adsorbed to the lower surface of the metallic frame which can be moved up and down, the elastic magnetic packing is provided with the upper suction hole and the lower suction hole, the upper flat plate holder made of transparent material is insertably arranged in a horizontal direction below the elastic magnetic packing, the upper circumferential edge of the upper flat plate holder is formed with the upper suction groove communicating with the upper suction hole, the upper flat holder is closely supported in a horizontal direction by vacuum in the upper suction groove covered by the elastic magnetic packing, the lower surface circumferential edge of the upper flat plate holder is formed with the lower suction groove communicating with the lower suction hole, the upper mask film is closely contacted with the lower surface of the upper flat plate holder by vacuum in the lower suction groove, so that the holding of the upper mask film can be carried out positively and accurately and its effect can be fully realized as the means for holding the upper mask film.

What is claimed is:

1. A double-surface concurrent exposure device providing, a horizontal moving mechanism which can be reciprocated in a horizontal direction while the sample being held by a sample holding device comprising in that the first groove for use in sucking by vacuum the flat plate holder of transparent material held by a frame and fixing it is formed at a lower circumferential edge of said flat plate holder, the second groove for use in sucking by vacuum a mask film on the upper surface of said flat plate holder and fixing it is formed at the upper surface of said flat plate holder, and suction holes for use in sucking by vacuum and fixing the lower surface of the end part of said sample are communicated with the mask film and said flat plate holder, respectively; and a lifting mechanism in a vertical direction in that a plate-like elastic magnetic packing being substantially the same shape as that of said metallic frame is adsorbed at a lower surface of a metallic fame which can be moved up or down, said elastic magnetic packing is provided with an upper suction hole and a lower suction hole, the upper flat plate holder formed by transparent material is removably attached in a horizontal direction below the elastic magnetic packing, an upper circumferential edge of said upper flat plate holder is formed with an upper suction groove communicating with said upper suction hole, the upper flat plate holder is closely contacted and supported in a horizontal direction by vacuum in said upper suction groove covered by the elastic magnetic packing the lower circumferential edge of the upper flat plate holder being formed with the lower suction groove communicating with said lower suction hole and the upper mask film aligned at the upper surface of sample in advance being closely contacted and held with the lower surface of the upper flat plate holder by vacuum in the lower suction groove.

* * * * *